United States Patent
Pandey (10) Patent No.: US 7,859,356 B2
(45) Date of Patent: Dec. 28, 2010

(54) TRANSMISSION LINE SYSTEM HAVING HIGH COMMON MODE IMPEDANCE

(75) Inventor: Shree Krishna Pandey, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 117 days.

(21) Appl. No.: 12/053,227

(22) Filed: Mar. 21, 2008

(65) Prior Publication Data

US 2009/0237172 A1 Sep. 24, 2009

(51) Int. Cl.
*H01P 3/08* (2006.01)
(52) U.S. Cl. .......................................... 333/1; 333/238
(58) Field of Classification Search ...................... 333/1, 333/4, 5, 238
See application file for complete search history.

(56) References Cited

U.S. PATENT DOCUMENTS

| | | | |
|---|---|---|---|
| 5,359,595 A | 10/1994 | Weddle et al. | |
| 5,418,504 A * | 5/1995 | Nottenburg | 333/1 |
| 5,664,948 A | 9/1997 | Dimitriadis et al. | |
| 5,733,131 A | 3/1998 | Park | |
| 6,081,513 A | 6/2000 | Roy | |
| 6,091,709 A | 7/2000 | Harrison et al. | |
| 6,243,761 B1 | 6/2001 | Mogul et al. | |
| 6,256,509 B1 | 7/2001 | Tanaka et al. | |
| 6,288,739 B1 | 9/2001 | Hales et al. | |
| 6,430,196 B1 | 8/2002 | Baroudi | |
| 6,611,503 B1 | 8/2003 | Fitzgerald et al. | |
| 6,778,493 B1 | 8/2004 | Ishii | |
| 6,797,891 B1 | 9/2004 | Blair et al. | |
| 6,813,638 B1 | 11/2004 | Sevanto et al. | |
| 6,865,610 B2 | 3/2005 | Bolosky et al. | |
| 6,867,668 B1 | 3/2005 | Dagostino et al. | |
| 7,143,177 B1 | 11/2006 | Johnson et al. | |
| 7,145,411 B1 | 12/2006 | Blair et al. | |
| 7,336,139 B2 | 2/2008 | Blair et al. | |
| 2002/0050870 A1* | 5/2002 | Koga | 333/1 |
| 2004/0000959 A1* | 1/2004 | Howard et al. | 333/4 |
| 2004/0085149 A1* | 5/2004 | Shimada et al. | 333/4 |
| 2005/0056455 A1 | 3/2005 | Masu et al. | |
| 2005/0099240 A1* | 5/2005 | Lin et al. | 333/5 |

OTHER PUBLICATIONS

International Search Report, PCT/US2009/035869, International Searching Authority—European patent Office—Jun. 12, 2009.
Written Opinion of the International Seasrching Authority, PCT/US2009/035869, International Searching Authority—European Patent Office—Jun. 12, 2009.
Krzysztof Sachse et al: "Quasi-Ideal Multilayer Two- and Three-Strip Directional Couplers for Monolithic and Hybrid MIC's", IEEE Transactions on Microwave Theory and Techniques, IEEE Service Centr, Piscataway, NJ, US. vol. 47, No. 9, Sep. 1, 1999.
J. Sevanto, "Multimedia messaging service for GPRS and UMTS", IEEE on WCNC, Sep. 1999, pp. 1422-1426, vol. 3.

* cited by examiner

*Primary Examiner*—Benny Lee
(74) *Attorney, Agent, or Firm*—Ashish L. Patel (57) ABSTRACT

Systems having three coupled transmission lines designed in such a way that any two of which taken together can be used as a differential transmission line with a roughly equal differential mode characteristic impedance while achieving high level of common mode characteristic impedance. The high level of common mode characteristic impedance is achieved by arrangement of the three transmission lines in distinct planes along a transmission axis.

54 Claims, 7 Drawing Sheets

TRANSMISSION LINE SYSTEM HAVING HIGH COMMON MODE IMPEDANCE

FIELD OF THE INVENTION

The present invention relates generally to the field of electronics, and more particularly to the field of signal transmission and processing within electronic devices including mobile stations and the like.

BACKGROUND

The demand for innovative and specialized portable electronic devices is ever increasing, and accordingly the design, packaging and functionality of electronic devices is constantly adapting and improving to meet the demand. Numerous devices employ two transmission lines for conducting differential signals within the device. However, with the increase in complexity and functionality of many devices, such as mobile phones, computers, personal digital assistants, personal navigation systems and the like, there is an increased need for a transmission line system that can handle differential signals in a multiplexed fashion. Moreover, in an electrical system that uses differential signaling and uses differential transmission lines to transport signals it is advantageous to have high common mode characteristic impedance between the transmission lines, while maintaining the desired differential mode characteristic impedance.

Unfortunately, systems having three or more transmission lines have a number of undesirable side effects, including adverse effects on the differential and common mode impedances of the transmission lines. In order to avoid the aforementioned adverse effects, some transmission line systems employ ground or power strips disposed between the transmission lines to retain the desired differential mode characteristic impedance results. Unfortunately, it is often the case that the presence of additional ground or power strips reduces the common mode impedance of the transmission lines, which is undesirable in a number of applications. Moreover, the addition of the ground and power strips increases the complexity, cost, and size of the package and restricts the environments in which it can be used.

As such, there is a need in the art for a transmission line system that can employ differential signaling using three or more transmission lines wherein any two of the three transmission lines exhibit roughly equal differential mode characteristic impedance while maintaining high common mode characteristic impedance.

SUMMARY OF THE INVENTION

The aspects disclosed herein address the above stated needs. Accordingly, the aspects of the present invention include systems having three coupled transmission lines designed in such a way that any two of which taken together can be used as a differential transmission line with a roughly equal differential mode characteristic impedance while achieving high level of common mode characteristic impedance. The high level of common mode characteristic impedance is achieved by careful arrangement of the three transmission lines in two separate layers and avoiding the use of ground, power or floating strips between the transmission lines.

In one aspect, the present invention includes a coupled transmission line system including a trio of independent transmission lines, each adapted to transport signals from a signal source to a signal destination. The trio of independent transmission lines includes a first transmission line, a second transmission line, and a third transmission line, each oriented in a substantially uniform direction along a transmission axis. Moreover, each of the first, second and third transmission lines further are oriented such that an imaginary plane parallel to the transmission axis will intersect no more than two of the first, second and third transmission lines and such that any predetermined pair of the first, second and third transmission lines have a substantially equal differential mode characteristic impedance (Zdiff).

In another aspect, the present invention includes a coupled transmission line system including a pair of independent transmission lines, each adapted to transport signals from a signal source to a signal destination. The pair of transmission lines is oriented in a substantially uniform direction along a transmission axis and further arranged such that the pair of transmission lines is substantially intersected by a first imaginary plane through which the transmission axis passes. The coupled transmission line system can also include a third transmission line independent from the pair of transmission lines oriented in a substantially uniform direction along the transmission axis. The third transmission line can be disposed in a second imaginary plane that is distinct from the first imaginary plane.

In another aspect, the present invention includes coupled transmission line system for use in an electrical device, such as for example a mobile phone of the flip-open or clamshell variety. The coupled transmission line system can include a multilayer structure comprising at least a first layer and a second layer and a pair of independent transmission lines disposed on a first side of the first layer of the multilayer structure. The system can further include a third transmission line independent from the pair of transmission lines and disposed on a first side of the second layer of the multilayer structure, wherein the first and second layers of the multilayer structure are distinct.

The various aspects of the present invention can operate without the need for supplemental ground or power strips, improving the performance of the system and adding flexibility in packaging and application while reducing the size and cost of the system. Further aspects, features and advantages of the present invention are described in detail below with reference to the following Figures.

DETAILED DESCRIPTION OF THE INVENTION

The present invention is described herein with reference to its preferred aspects and selected variations thereof. As the following detailed description is both enabling and exemplary in nature, it should not be construed as limiting the scope of the following claims. The present invention, presented in its various aspects, generally includes three coupled transmission lines disposable on two separate layers of a package, printed circuit board (PCB) or any multilayer stackup in such a way that the differential mode characteristic impedance (Zdiff) is a desired value, such as, for example 100 ohms. The design does not use ground strips between the transmission lines. As a result the common mode characteristic impedance (Zcomm) is higher, which results in higher common mode rejection ratio for the system, and overall improved system performance.

Figure 6:
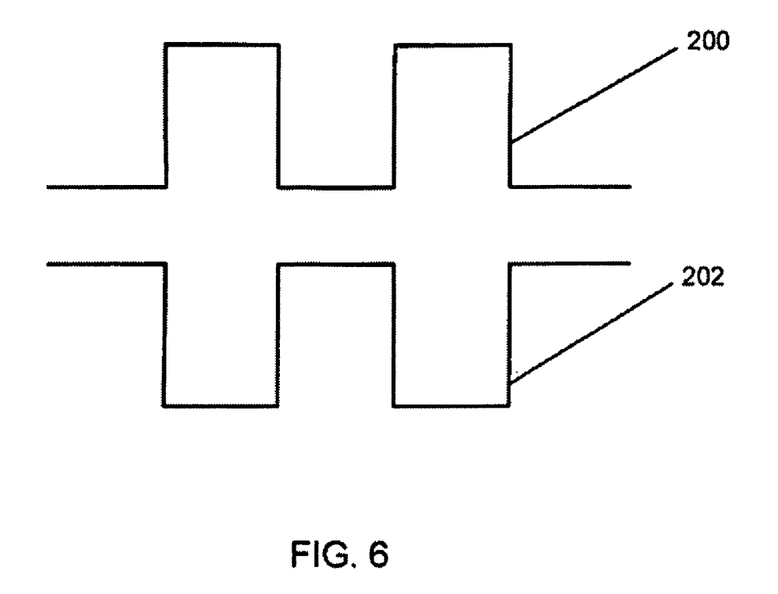
FIG. 6 is a graphical representation of a differential mode signal.
Figure 7:
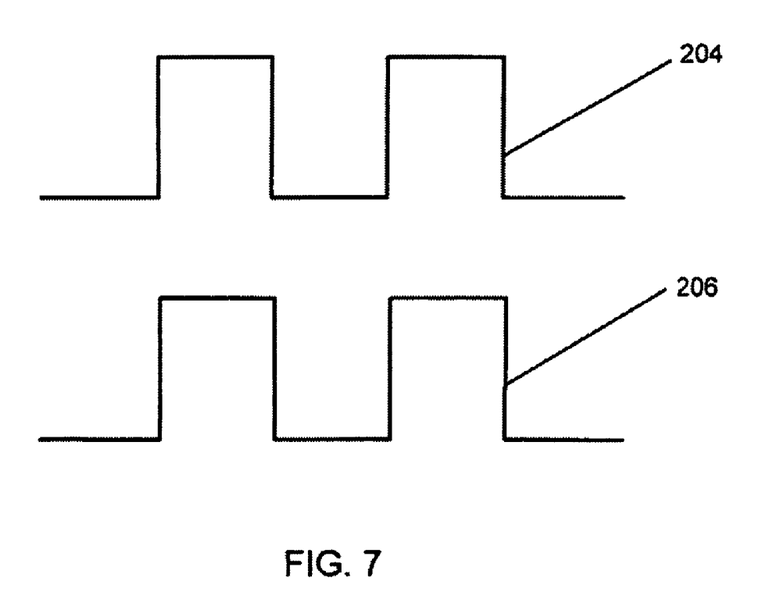
FIG. 7 is a graphical representation of a common mode signal.

There are three ways the transmission lines can be paired. Each of these transmission line pairs can transport differential signals, common mode signals or a combination of differential and common mode signals at any time. FIGS. 6 and 7 are illustrative of differential signaling waveforms and common signaling waveforms, respectively. The differential characteristic impedance of two transmission lines is defined as the impedance seen by the differential signal propagating in the two transmission lines that comprise a pair. An example of such a differential signal is shown in FIG. 6, where 200 represents the waveform on the positive line and 202 represents the waveform on the negative line and is the complementary of the waveform 200.

The common mode characteristic impedance of two transmission lines is defined as the impedance seen by the common mode signal propagating in the two transmission lines that comprise a pair. An example of such a common mode signal is shown in FIG. 7, where 204 represents the waveform on the positive line and 206 represents the waveform on the negative line and is the exact replica of the waveform 204.

In real world systems, it is often the case that any selected pair transports a combination of differential and common mode signals. In differential signaling standards, for example the Mobile Display Digital Interface (MDDI) standard, it is often the intention that the differential characteristic impedance of the pair be fixed impedance, for example 100 ohms, while the common mode characteristic impedance is as high as possible. A controlled Zdiff and a high Zcomm is desirable for good system design for differential signaling standards like the MDDI. The controlled Zdiff is chosen to match the impedance of other associated components in the system and helps to keep transmission line reflection low. High value of Zcomm helps to reject common mode noise.

FIGS. 1 through 5 are illustrative of a transmission line system in accordance with one aspect of the present invention. In the transmission line system, system 10 includes a trio of independent transmission lines 100 (FIGS. 1-4), each adapted to transport signals from a signal source to a signal destination. The trio of independent transmission lines 100 generally includes a first transmission line, a second transmission line, and a third transmission line, each of which is oriented in a substantially uniform direction along a transmission axis (perpendicular to the page). In one aspect of system 10, each of the first, second, and third transmission lines are further oriented such that an imaginary plane parallel to the transmission axis will intersect no more than two of the first, second and third transmission lines. As shown, for example in FIGS. 1 through 5, system 10 can include one or more reference planes 102 (FIGS. 1, 2), 104 (FIGS. 1, 2), 106 (FIGS. 3, 4), 110 (FIG. 5), 112 (FIG. 5), discussed in detail below, that are substantially parallel to the imaginary plane described above. The relative orientation of the first, second, and third transmission lines causes any predetermined pair of the first, second and third transmission lines have a substantially equal Zdiff.

In a first variation of system 10, the Zdiff value can range within a predetermined set of values depending upon the geometry of system 10, the frequency of the signals carried by trio of independent transmission lines 100, as well as specific performance parameters and/or functionalities for which system 10 is specifically designed. For example, the Zdiff value can range generally between eighty and one hundred twenty ohms for typical applications, and more specifically between ninety and one hundred ten ohms. In one alternative, the Zdiff value can be approximately one hundred ohms independent of the signal frequency as determined by the specific geometry and/or other features of system 10. In another alternative, the Zdiff can be approximately one hundred ohms in response to a signal frequency of 775 megahertz, which is a typical frequency for signal communications in a mobile station environment.

In a second variation of system 10, system 10 can include one or more reference planes 102, 104, 106, 110, and 112 disposed distally from and substantially parallel to the imaginary plane. Reference planes are known in the art of electronics and electrical engineering, functioning to provide a common return path for multiple source/load pairs. One or more reference planes 102, 104, 106, 110, and 112 can include for example a metal enclosure, plate, portion of a printed circuit board or other protective and/or functional element that offers zero or near-zero impedance of the return current carried by the one or more reference planes 102, 104, 106, 110 and 112.

In a third variation of system 10, the trio of independent transmission lines is oriented such that any predetermined pair of the first, second and third transmission lines exhibit substantially high Zcomm. In one alternative, the Zcomm between any predetermined pair of the first, second, and third transmission lines 100 can be between forty and fifty-five ohms, preferably approximately forty-nine ohms. In another alternative, the Zcomm between the co-planar pair of transmission lines can be a first value, and the Zcomm between any one of the co-planar pair of transmission lines and the third transmission line can be another value. For example, the Zcomm between the first and second transmission lines can be between forty-eight and fifty-two ohms, while the Zcomm between the second and third transmission lines and the first and third transmission lines, respectively, can be between forty-four and forty-six ohms, independent of system 10 geometry or the signal frequency. In yet another alternative, the Zcomm value can be dependent upon the signal frequency such that the Zcomm between any predetermined pair of the first, second and third transmission lines is between forty and fifty-five ohms in response to a signal frequency of 775 megahertz. In a typical transmission line system, the Zcomm value is between twenty-five and thirty ohms, thus the example aspects of the present invention provide an improvement in the Zcomm value of at least forty-six percent.

In another variation of system 10, system 10 can include a dielectric material within which the trio of transmission lines 100 is disposed. The dielectric material functions to stifle the conduction of electricity as well as to promote the generation of electrostatic fields within system 10. The dielectric material can be any suitable material that can generate the necessary Zdiff and Zcomm values within a given system 10 and its geometry and signal frequency. Suitable dielectric materials are well known to those of skill in the art. In one alternative, the dielectric constant of the dielectric material is less than five. In another alternative, the dielectric constant of the dielectric material is approximately 4.4. The dielectric material can be composed of one or more materials, and can have a substantially uniform dielectric constant throughout or it can have a predetermined and substantially variable dielectric constant throughout, depending on the geometry and signal frequency of system 10.

Figure 1:
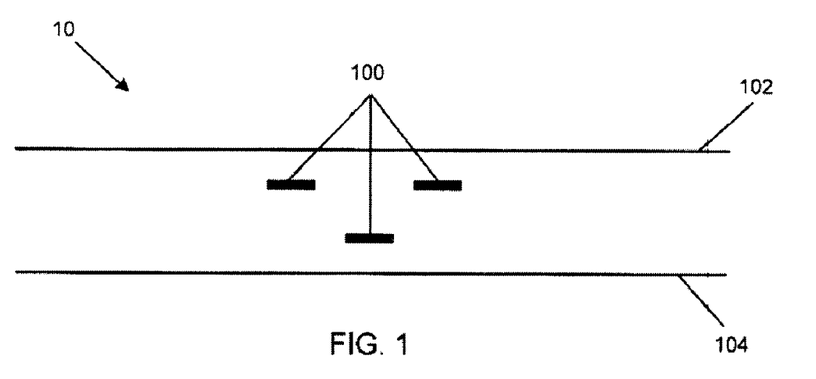
FIG. 1 is a schematic cross-sectional diagram of a transmission line system in accordance with one aspect of the present invention.
Figure 2:
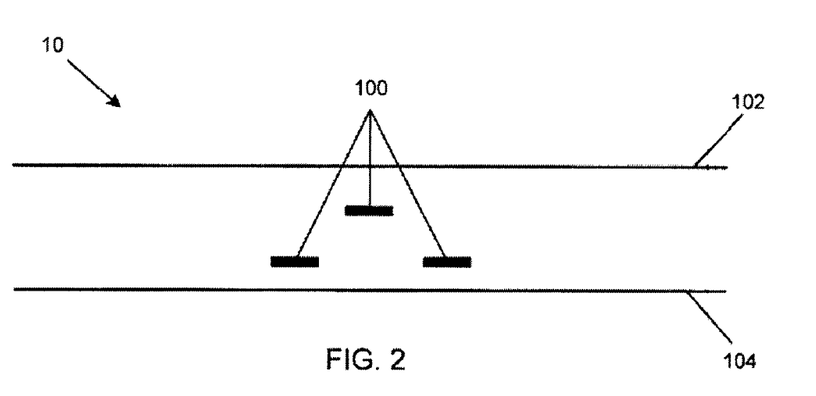
FIG. 2 is a schematic cross-sectional diagram of a transmission line system in accordance with another aspect of the present invention.
Figure 3:
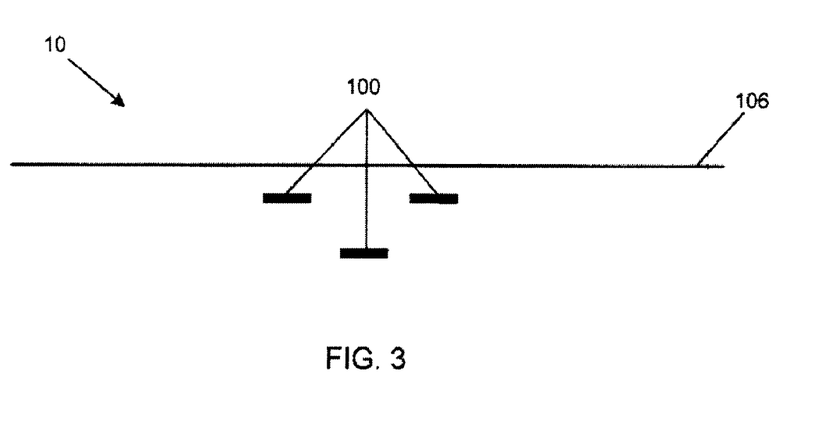
FIG. 3 is a schematic cross-sectional diagram of a transmission line system in accordance with another aspect of the present invention.
Figure 4:
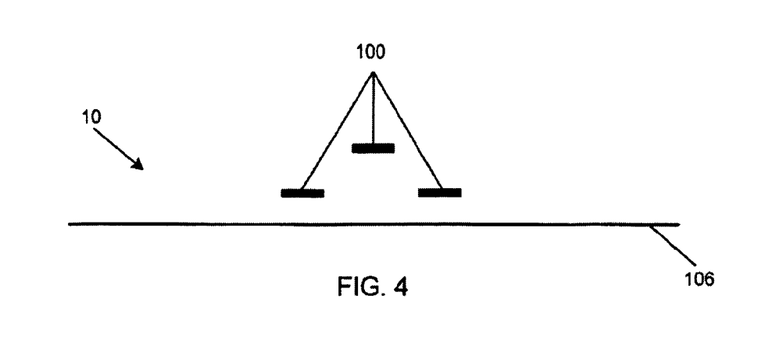
FIG. 4 is a schematic cross-sectional diagram of a transmission line system in accordance with another aspect of the present invention.
Figure 5:
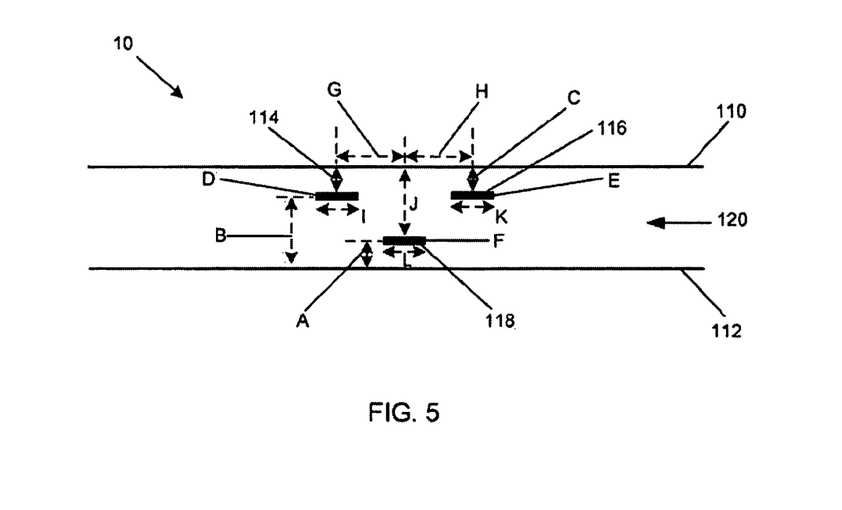
FIG. 5 is a schematic cross-sectional diagram of a transmission line system in accordance with another aspect of the present invention.

FIG. 5 illustrates an example configuration of system 10 including a suitable geometry for generating the desired Zdiff and Zcomm values of system 10. The variation of system 10 shown in FIG. 5 includes a lower reference plane 112, an upper reference plane 110, and a dielectric material 120 disposed between the reference planes 110 and 112. Within dielectric material 120, system 10 includes a first transmission line 114, a second transmission line 116 and a third transmission line 118 arranged in separate planes in accordance with the principles of the invention. As noted above, the dielectric material 120 can be of any type or combination of types and/or consistency that provides desirable performance of system 10.

FIG. 5 further illustrates an exemplary geometry of a typical system, including example distances and widths of the relative spacing between the components, wherein the spacing distances do not include the thickness and/or widths of the respective components, but rather refer to the distances between the respective components. For example, the designation A denotes the height of third transmission line 118 as measured from lower reference plane 112, which can range between four and eight mils (one mil is equal to one thousandth of an inch). Designation B denotes the height of the first and second transmission lines 114 and 116 as measured from lower reference plane 112, which can range between ten and fourteen mils. Designation C denotes the height of the first and second transmission lines 114 and 116 as measured from upper reference plane 110, which can range between four and eight mils. Each of the first, second and third transmission lines are between one half and one mil in thickness, measured perpendicular to the upper and lower reference planes 110 and 112, as denoted by designations D, E, and F.

In the example configuration of system 10, first and second transmission lines 114 and 116 are spaced apart from an imaginary center line by distances G and H, which can range between three and four mils as measured from the center of the respective transmission line. Third transmission line 118 can be disposed at a distance J from the upper reference plane, wherein J ranges between eighteen and twenty-two mils. Each of the first, second and third transmission lines 114, 116, and 118 can be between two and four mils in width, measured parallel to the upper and lower reference planes 110, 112, as denoted by designations I, K, and L.

Figure 8:
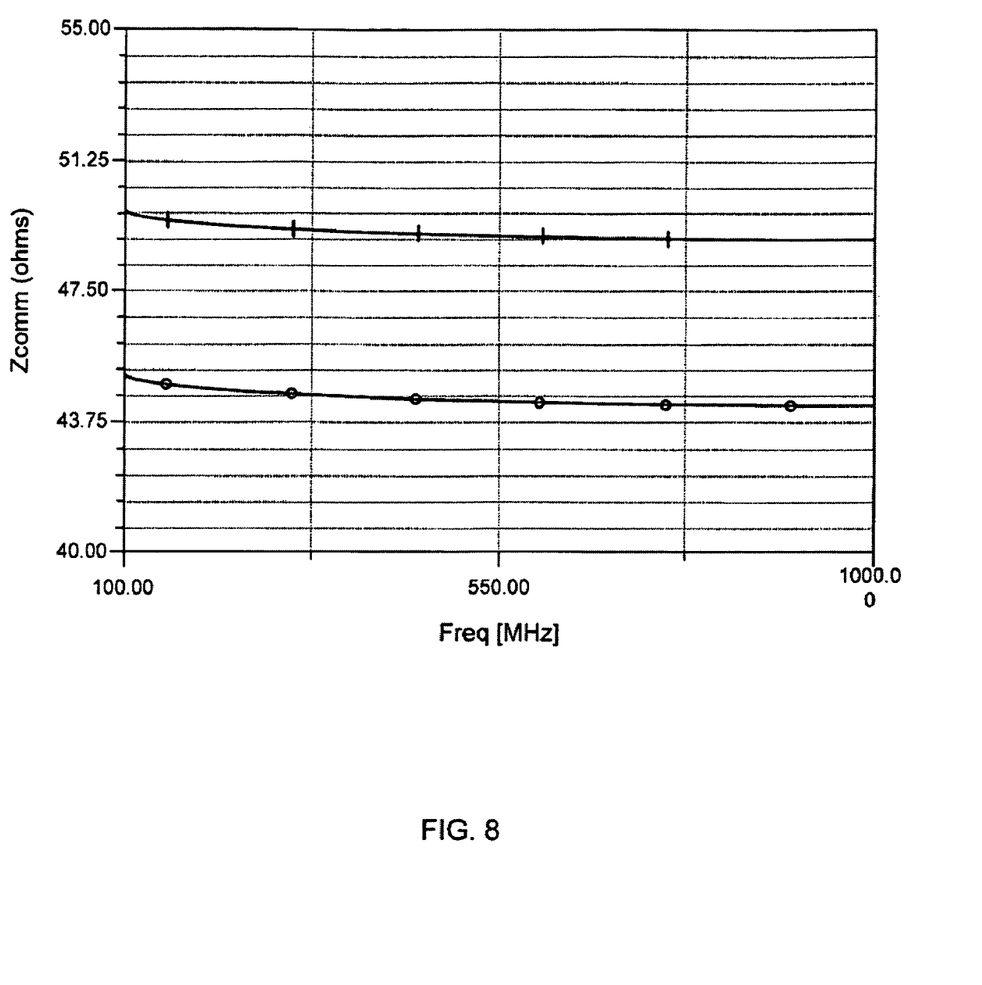
FIG. 8 is a graphical representation of a common mode characteristic impedance seen by an example common mode signal transmitted according to one aspect of the transmission line system of the present invention.
Figure 9:
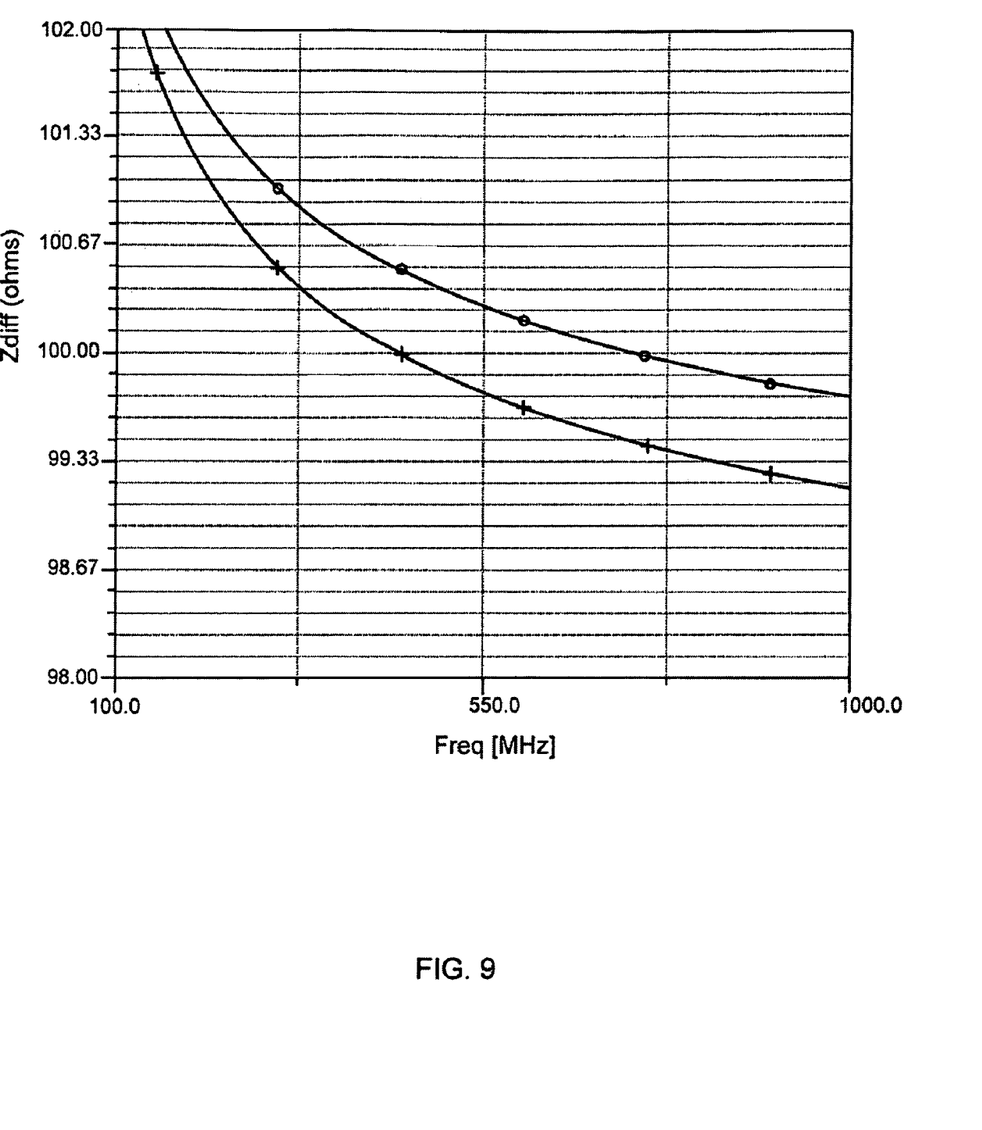
FIG. 9 is a graphical representation of a differential mode characteristic impedance seen by an example differential mode signal transmitted according to one aspect of the transmission line system of the present invention.

Simulated testing of the example configuration shown in FIG. 5 produced the results shown graphically in FIGS. 8 and 9 that show Zcomm and Zdiff in ohms as a function of frequency, respectively. As shown in FIG. 8, at 775 MHz Zcomm is approximately 44.3 ohms (bottom curve) for the interlayer pairs (i.e. one of the first and second transmission lines 114, 116 paired with the third transmission line 118) and 49.1 ohms (top curve) for the coplanar pair (i.e. the first and second transmission lines 114, 116 pair). These values are significantly higher than would be achieved by more conventional arrangements, which as noted above would typically result in Zcomm in the range of 25 to 30 ohms.

Figure 10:
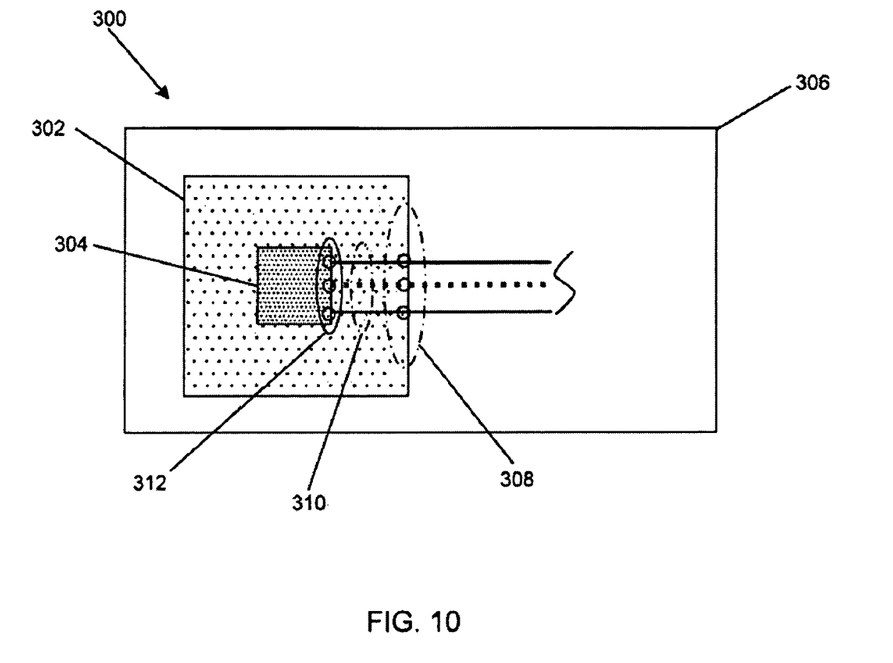
FIG. 10 is a plan view of a multilayer structure using a variation of the transmission line system.

Similarly, FIG. 9 shows at 775 MHz, the Zdiff is 100 ohms (top curve) for the interlayer pairs and 99.4 ohms (bottom curve) for the coplanar pair. Note that there are slight variations (under 1%) in differential impedance of the coplanar and interlayer pairs in this particular design, but any variations can be minimized and/or eliminated in other configurations of system 10 described herein. Other example configurations of system 10 are shown in FIGS. 10, 11, 12, and 13. FIG. 10 is a plan view of a multilayer structure using a variation of the transmission line system 10. The example multilayer structure 300 shown in FIG. 10 includes a printed circuit board (PCB) 306, such as that used in a mobile station or other electronic device. A package 302 is disposed on PCB 306, and a silicon die 304 is disposed on or integrated into package 302. A trio of transmission lines 310 are connected to the silicon die via a set of die bumps 312, and route through a set of package pins 308 on or through PCB 306. The solid-lined transmission lines are on a top, coplanar level, and the third transmission line, shown in phantom, is on a lower, non-visible layer. As noted above, multilayer structure 300 can include a printed circuit board, an integrated circuit, a flex cable, or a semiconductor chip or any other type of electronic component for which signal transmission via transmission line systems is desired.

Figure 11:
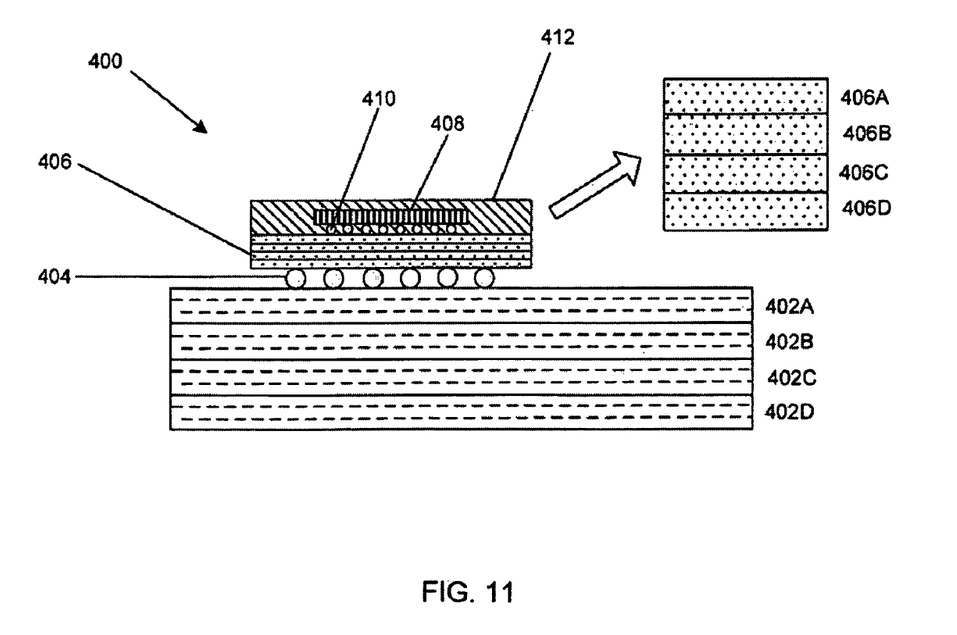
FIG. 11 is a cross-sectional view of a multilayer structure using a variation of the transmission line system.

FIG. 11 is a cross-sectional view of a multilayer structure 400 using a variation of the transmission line system, such as that shown above with reference to FIG. 10. The package 400 includes a multilayer PCB 402A, 402B, 402C, 402D to which a multilayer package 406 is connected via a series of package pins 404. The multilayer package 406 can include one or more substrate layers defining one or more surfaces and/or interfaces 406A, 406B, 406C, 406D. A plurality of die bumps 410 connect a silicon die 408 to multilayer package 406, all of which can be encapsulated in a mold compound 412 as is known in the art.

Figure 12A:
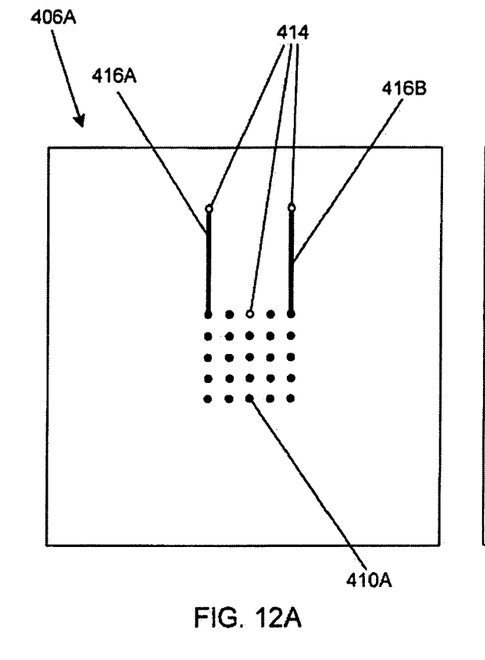
FIGS. 12A and 12B are plan views of selected layers of a multilayer structure using a variation of the transmission line system.
Figure 12B:
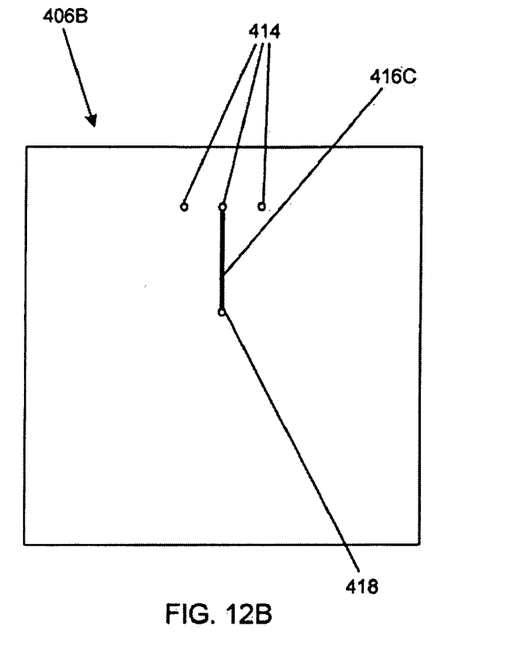
Figure 13A:
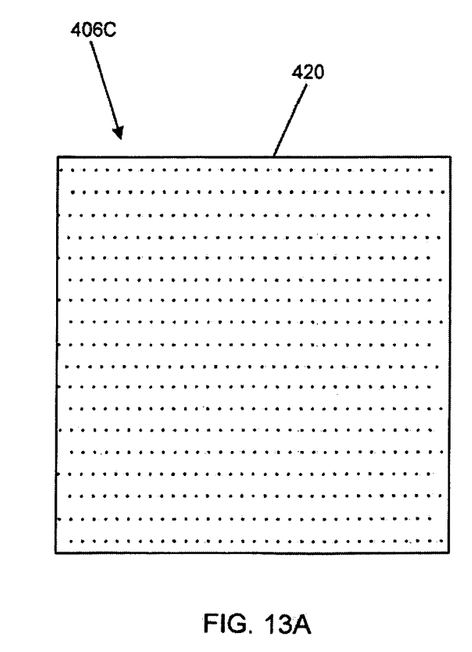
FIGS. 13A and 13B are plan views of selected layers of a multilayer structure using a variation of the transmission line system.
Figure 13B:
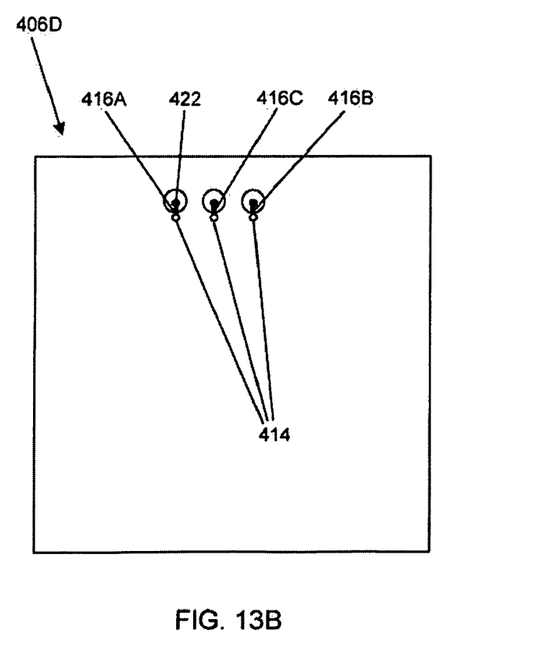

FIGS. 12A, 12B, 13A and 13B illustrate one manner in which the transmission line system can be integrated into a multilayer structure of the type shown in FIG. 11. FIG. 12A depicts the top plan view of a first layer 406A and FIG. 12B depicts the top plan view of a second layer 406B of the multilayer package 406. On the top of the first layer 406A, as shown in FIG. 13A, a series of die bump pads 410A and a set of vias 414 are shown in an array. Coplanar transmission lines 416A, 416B extend from two of the die bump pads 410A to distal vias 414. On the top of second layer 406B, as shown in FIG. 13B, a third transmission line 416C extends from a combination via/pad 418 in the direction of vias 414, which in the stacking process would match with vias 414 through which the coplanar transmission lines 416A, 416B (FIG. 12A) pass.

As shown in FIG. 13A, a third layer 406C can act as a reference plane 420, a ground or power (voltage) reference plane. As such, first, second and third layers 406A, 406B, 406C create a multilayer structure having two coplanar transmission lines 416A, 416B and a third transmission line 416C, all of which are disposed relative to a reference plane 420 as shown in FIGS. 1 through 5. Many suitable methods can be utilized to connect transmission lines 416A, 416B, and 416C to pins on either end of the multilayer structure. For example, one can utilize a via/pad combination 418 described above to bring one of the transmission lines to the second layer of the multilayer structure. Alternatively as shown in FIG. 13B, one can create one or more vias 414 near the pins 422, in the fourth layer 406 D. The respective transmission lines 416A, 416B, 416C can pass through each of the multiple layers and connect to the pins 422. One or more of the layers of the multilayer package 406 (FIG. 11) can be composed a least partially of a dielectric material in order to produce optimal values for the Zdiff and Zcomm between the transmission lines 416A, 416B, 416C.

Each aspect of the present invention can be readily incorporated into a mobile station. As used herein, a mobile station (MS) refers to a device such as a cellular or other wireless communication device, personal communication system (PCS) device, personal navigation device, laptop or other suitable mobile device capable of receiving and processing SPS (satellite positioning system) signals. The term "mobile station" is also intended to include devices which communicate with a personal navigation device (PND), such as by short-range wireless, infrared, wireline connection, or other connection—regardless of whether satellite signal reception, assistance data reception, and/or position-related processing occurs at the device or at the PND. Also, "mobile station" is intended to include all devices, including wireless communication devices, computers, laptops, etc. which are capable of communication with a server, such as via the Internet, WiFi, or other network, and regardless of whether satellite signal reception, assistance data reception, and/or position-related processing occurs at the device, at a server, or at another device associated with the network. Any operable combination of the above are also considered a "mobile station."

As a person skilled in the art will recognize from the previous detailed description and from the figures and claims, modifications and changes can be made to the aspects of the invention without departing from the scope of this invention defined in the following claims.

What is claimed is:

1. A coupled transmission line system comprising:
a trio of independent transmission lines, each adapted to transport signals from a signal source to a signal destination, the trio of independent transmission lines comprising a first transmission line, a second transmission line, and a third transmission line, each of the first, second and third transmission lines oriented in a substantially uniform direction along a transmission axis, and each of the first, second and third transmission lines further oriented such that an imaginary plane parallel to the transmission axis will intersect no more than two of the first, second and third transmission lines and such that any predetermined pair of the first, second and third transmission lines have a substantially equal differential mode characteristic impedance (Zdiff); and
the any predetermined pair of the first, second and third transmission lines exhibit substantially high common mode characteristic impedance (Zcomm), comprising forty (40) or more ohms.

2. The system of claim 1, wherein the Zdiff ranges between eighty and one hundred twenty ohms.

3. The system of claim 1, wherein the Zdiff ranges between ninety and one hundred ten ohms.

4. The system of claim 1, wherein the Zdiff is approximately one hundred ohms.

5. The system of claim 1, wherein the Zdiff is approximately one hundred ohms in response to a signal frequency of 775 megahertz.

6. The system of claim 1, further comprising a first reference plane disposed distally from and substantially parallel to the imaginary plane.

7. The system of claim 6, further comprising a second reference plane disposed distally from and substantially parallel to the first reference plane.

8. The system of claim 1, wherein the Zcomm between any predetermined pair of the first, second and third transmission lines is between forty and fifty-five ohms in response to a signal frequency of 775 megahertz.

9. The system of claim 1, wherein the Zcomm between exhibited by the any predetermined pair of the first, second and third transmission lines is between forty and fifty-five ohms.

10. The system of claim 1, wherein the Zcomm between the first and second transmission lines is between forty-eight and fifty-two ohms.

11. The system of claim 1, wherein the Zcomm between the second and third transmission lines is between forty-four and forty-six ohms.

12. The system of claim 1, wherein the Zcomm between the first and third transmission lines is between forty-four and forty-six ohms.

13. The system of claim 1, further comprising a dielectric material within which the trio of transmission lines is disposed.

14. The system of claim 13, wherein the dielectric constant of the dielectric material is approximately 4.4.

15. The system of claim 13, wherein the dielectric constant of the dielectric material is less than five.

16. A coupled transmission line system comprising:
a pair of independent transmission lines, each adapted to transport signals from a signal source to a signal destination, the pair of transmission lines oriented in a substantially uniform direction along a transmission axis and further arranged such that the pair of transmission lines are substantially intersected by a first imaginary plane through which the transmission axis passes, wherein the pair of independent transmission lines exhibit substantially high common mode characteristic impedance (Zcomm), comprising forty (40) or more ohms; and
a third transmission line independent from the pair of transmission lines, the third transmission line adapted to transport signals from the signal source to the signal destination, the third transmission line oriented in a substantially uniform direction along the transmission axis and further arranged such that the third transmission line lies in a second imaginary plane that is distinct from the first imaginary plane, wherein the third transmission line and one of the pair of independent transmission lines exhibit substantially high Zcomm, comprising forty (40) or more ohms.

17. The system of claim 16, further comprising a first reference plane disposed distally from and substantially parallel to the first imaginary plane.

18. The system of claim 16, further comprising a second reference plane disposed distally from and substantially parallel to the first reference plane.

19. The system of claim 16, wherein a differential mode characteristic impedance (Zdiff) between the pair of transmission lines ranges between eighty and one hundred twenty ohms.

20. The system of claim 16, wherein a differential mode characteristic impedance (Zdiff) between the pair of transmission lines ranges between ninety and one hundred ten ohms.

21. The system of claim 16, wherein a differential mode characteristic impedance (Zdiff) between the pair of transmission lines is approximately one hundred ohms.

22. The system of claim 16, wherein the pair of independent transmission lines, and the third transmission line and the one of the pair of independent transmission lines have a substantially equal differential mode characteristic impedance (Zdiff).

23. The system of claim 22, wherein the Zdiff ranges between eighty and one hundred twenty ohms.

24. The system of claim 22, wherein the Zdiff ranges between ninety and one hundred ten ohms.

25. The system of claim 22, wherein the Zdiff is approximately one hundred ohms.

26. The system of claim 16, further comprising a dielectric material within which the pair of independent transmission lines and the third transmission line are disposed.

27. The system of claim 26, wherein the dielectric constant of the dielectric material is less than five.

28. The system of claim 26, wherein the dielectric constant of the dielectric material is approximately 4.4.

29. The system of claim 16, wherein the Zcomm between the pair of independent transmission lines is between forty-five and fifty-five ohms.

30. The system of claim 16, wherein the Zcomm between the pair of independent transmission lines is approximately forty-nine ohms.

31. The system of claim 16, wherein the Zcomm between the third transmission line and the one of the pair of independent transmission lines is between forty and fifty-five ohms.

32. The system of claim 16, wherein the Zcomm between the third transmission line and the one of the pair of independent transmission lines is between forty-four and forty-six ohms.

33. A coupled transmission line system for use in an electrical device, comprising:
   a multilayer structure comprising at least a first layer and a second layer;
   a pair of independent transmission lines disposed on a first side of the first layer of the multilayer structure, each of the pair of transmission lines adapted to transport signals from a signal source to a signal destination, wherein the pair of independent transmission lines exhibit substantially high common mode characteristic impedance (Zcomm), comprising forty (40) or more ohms;
   a third transmission line independent from the pair of transmission lines and disposed on a first side of the second layer of the multilayer structure, the third transmission line adapted to transport signals from the signal source to the signal destination, wherein the third transmission line and one of the pair of independent transmission lines exhibit substantially high Zcomm, comprising forty (40) or more ohms.

34. The system of claim 33, wherein the Zcomm between the third transmission line and the one of the pair of independent transmission lines is between forty-four and forty-six ohms.

35. The system of claim 33, wherein the Zcomm between the third transmission line and the one of the pair of independent transmission lines is between forty and fifty-five ohms.

36. The system of claim 33, wherein the Zcomm between the pair of independent transmission lines is approximately forty-nine ohms.

37. The system of claim 33, wherein the multilayer structure comprises one of a printed circuit board, an integrated circuit, a flex cable, an integrated circuit package or a semiconductor chip.

38. The system of claim 33, wherein the Zcomm between the pair of independent transmission lines is between forty-five and fifty-five ohms.

39. The system of claim 33, wherein a differential mode characteristic impedance (Zdiff) between the pair of transmission lines ranges between eighty and one hundred twenty ohms.

40. The system of claim 33, wherein a differential mode characteristic impedance (Zdiff) between the pair of transmission lines ranges between ninety and one hundred ten ohms.

41. The system of claim 33, wherein a differential mode characteristic impedance (Zdiff) between the pair of transmission lines is approximately one hundred ohms.

42. The system of claim 33, wherein the pair of independent transmission lines, and the third transmission line and the one of the pair of independent transmission lines have a substantially equal differential mode characteristic impedance (Zdiff).

43. The system of claim 42, wherein the Zdiff ranges between eighty and one hundred twenty ohms.

44. The system of claim 42, wherein the Zdiff ranges between ninety and one hundred ten ohms.

45. The system of claim 42, wherein the Zdiff is approximately one hundred ohms.

46. A method of forming a coupled transmission line system for use in an electrical device, comprising:
   employing a multilayer structure comprising at least a first layer and a second layer;
   disposing a pair of independent transmission lines on a first side of the first layer of the multilayer structure, each of the pair of transmission lines adapted to transport signals from a signal source to a signal destination, such that the pair of independent transmission lines exhibit substantially high common mode characteristic impedance (Zcomm), comprising forty (40) or more ohms;
   disposing a third transmission line independent from the pair of transmission lines on a first side of the second layer of the multilayer structure, the third transmission line adapted to transport signals from the signal source to the signal destination, such that the third transmission line and one of the pair of independent transmission lines exhibit substantially high Zcomm, comprising forty (40) or more ohms.

47. The method of claim 46, wherein the multilayer structure comprises one of a printed circuit board, an integrated circuit, a flex cable, an integrated circuit package or a semiconductor chip.

48. The method of claim 46, wherein the pair of independent transmission lines, and the third transmission line and the one of the pair of independent transmission lines have a substantially equal differential mode characteristic impedance (Zdiff).

49. The method of claim 46, wherein the Zcomm between the third transmission line and the one of the pair of independent transmission lines is between forty and fifty-five ohms.

50. A method of forming a coupled transmission line system comprising:
   disposing a trio of independent transmission lines, each adapted to transport signals from a signal source to a signal destination, the trio of independent transmission lines comprising a first transmission line, a second transmission line, and a third transmission line, such that each of the first, second and third transmission lines are oriented in a substantially uniform direction along a transmission axis, and each of the first, second and third transmission lines are further oriented such that an imaginary plane parallel to the transmission axis will intersect no more than two of the first, second and third transmission lines and such that any predetermined pair of the first, second and third transmission lines have a substantially equal differential mode characteristic impedance (Zdiff); and wherein the any predetermined pair of the first, second and third transmission lines exhibit substantially high common mode characteristic impedance (Zcomm), comprising forty (40) or more ohms.

51. The method of claim 50, wherein the Zcomm exhibited by the any predetermined pair of the first, second and third transmission lines is between forty and fifty-five ohms.

52. The method of claim 50, further comprising a dielectric material within which the trio of transmission lines is disposed.

53. The method of claim 52, wherein the dielectric constant of the dielectric material is approximately 4.4.

54. The method of claim 52, wherein the dielectric constant of the dielectric material is less than five.

* * * * *